United States Patent [19]

Macioch et al.

[11] Patent Number: 5,468,588
[45] Date of Patent: Nov. 21, 1995

[54] PROCESS FOR MANUFACTURING DIFFUSION TRANSFER PRINTING PLATES

[75] Inventors: Michael T. Macioch, Baldwin, Wis.; Douglas M. Gates, White Bear Lake, Minn.; Timothy M. Leary, Rochester, N.Y.

[73] Assignee: Minnesota Mining and Manufacturing Company, St. Paul, Minn.

[21] Appl. No.: 324,576

[22] Filed: Oct. 18, 1994

[51] Int. Cl.$^6$ ................................ G03C 8/28; G03F 7/07
[52] U.S. Cl. ................... 430/229; 430/204; 430/231; 430/232; 430/935
[58] Field of Search ........................ 430/204, 231, 430/232, 935, 229

[56] References Cited

U.S. PATENT DOCUMENTS

| | | | |
|---|---|---|---|
| 3,313,625 | 4/1967 | Ryan | 430/232 |
| 3,547,641 | 12/1970 | Blake | 430/204 |
| 3,728,114 | 4/1973 | Futaki et al. | 430/204 |
| 3,870,479 | 3/1975 | Kubotera et al. | 430/204 |
| 4,160,670 | 7/1979 | Tsubai et al. | 430/204 |
| 4,361,635 | 11/1982 | Kinderman et al. | 430/204 |
| 4,510,228 | 4/1985 | Tsubai et al. | 430/204 |
| 4,621,041 | 11/1986 | Saikawa et al. | 430/204 |
| 4,784,933 | 11/1988 | Kanada et al. | 430/204 |
| 5,102,770 | 4/1992 | Baba et al. | 430/249 |
| 5,200,296 | 4/1993 | Nagamatsu et al. | 430/232 |
| 5,202,218 | 4/1993 | Yoshida et al. | 430/204 |
| 5,281,506 | 1/1994 | Badesha et al. | 430/124 |
| 5,368,894 | 11/1994 | Lammets et al. | 427/407.1 |

FOREIGN PATENT DOCUMENTS

0546598A1  11/1992  European Pat. Off. .

*Primary Examiner*—Richard L. Schilling
*Attorney, Agent, or Firm*—Gary L. Griswold; Walter N. Kirn; Susan Moeller Zerull

[57] ABSTRACT

A method of manufacturing a photosensitive element which can be exposed and enveloped by diffusion transfer processes to form a lithographic printing plate, said method comprising the steps of:

(a) providing a support layer, (b) coating a negative acting silver halide emulsion layer onto said support layer, and (c) coating a physical development nucleation layer comprising particles onto said silver halide emulsion layer, wherein the coating of said physical development nucleation layer is performed with a coating composition which is at a temperature above 0° C. and below 30° C.

4 Claims, No Drawings

PROCESS FOR MANUFACTURING DIFFUSION TRANSFER PRINTING PLATES

BACKGROUND OF THE INVENTION

1. Field of the Invention

This invention relates to a method of making a photosensitive element which, upon imagewise radiation exposure and wet development, can be made into a lithographic printing plate by the silver complex diffusion transfer process. In particular, this invention relates to a process for coating the layers in the photosensitive element which improves the sensitometric performance of the finished plate.

2. Background of the Art

Photosensitive elements which can produce lithographic printing plates are well known in the art as represented by U.S. Pat. Nos. 3,870,479; 4,621,041; 4,160,670; 4,784,933; 4,510,228; 5,202,218; and 5,281,506. These patents disclose printing plates which are made by the imagewise exposure of a photosensitive element and the formation of a silver complex layer on the surface of the medium to differentially hold or repel inks.

These photosensitive elements essentially comprise a substrate, a negative-acting silver halide emulsion layer, and a surface receptor layer which has deposition nuclei (e.g., palladium particles). Upon exposure of the silver halide emulsion layer, the exposed photosensitive element is developed with black and white developing agents in the presence of a silver halide solvent (e.g., thiosulfate, thiocyanate, aminoalkanols, etc.). The development may occur using either an alkaline developing solution or activator solution. If an activator solution is used, developing agents are incorporated directly into the photosensitive element. In the exposed portions of the photosensitive element the silver halide is reduced to a black silver image. In the unexposed portions, the silver halide solvent causes the silver halide to diffuse. At least some of the silver halide diffuses to the receptor layer where the deposition nuclei and the developer together reduce the silver halide to a metallic silver. Complexing the metallic silver with an organic complexing agent renders the surface of the element hydrophobic (oleophilic).

These photosensitive elements have, to the knowledge of the present inventors, been made by coating the silver halide emulsion layer and subsequently applying the deposition nuclei layer at an elevated temperature onto the first coated silver halide emulsion layer. In the manufacturing experience of the inventors on diffusion transfer printing plates, the deposition nuclei layer has been traditionally coated at temperatures of about 35°–55° C. The deposition nuclei coating solution may be either an organic solvent based system or aqueous based system having little or no organic solvents.

In a review of the prior art, all examined references were silent as to the coating temperature of the receptor layer with deposition nuclei.

SUMMARY OF INVENTION

The present invention describes a process for manufacturing a photosensitive element capable of generating a lithographic printing plate upon exposure and diffusion transfer development. The process comprises coating a substrate with a negative-acting silver halide emulsion layer and then coating a deposition nuclei surface layer onto the coated substrate at a temperature below 30° C. Coating the deposition nuclei layer at these relatively low temperatures improves the speed and contrast of the photosensitive element as compared to a photosensitive element coated at the traditionally higher temperatures.

DESCRIPTION OF THE INVENTION

The present invention relates to a photosensitive element which can be developed into a lithographic printing plate by the diffusion transfer process. These photosensitive elements comprise a support or substrate having coated thereon at least a light sensitive silver halide layer and a physical development nucleating surface layer. An antihalation layer and other optional layers, such as antistatic layers, may be included as underlayers between the photosensitive silver halide layer and the support or as a backcoating on the opposite side of the support from the photosensitive and receptor layers.

As described in various embodiments, e.g., U.S. Pat. Nos. 3,728,114, 4,160,670, 4,361,635 and EP 375,159, the product produced by such a process can function as a lithographic printing plate due to the oleophilic nature of the complexed silver in the receptor layer and the hydrophilic emulsion layer. The greater the differentiation between the (unexposed) complexed silver and the (exposed) developed image area, the better the printing quality will be. The inventive method of producing these photosensitive elements minimizes intermingling of the receptor layer and the silver halide emulsion layer and thereby provides improved differentiation between the unexposed regions and the exposed regions.

The photosensitive elements of the present invention are made by first providing an appropriate support layer, which is preferably flexible. Suitable support layers include such things as paper, treated or coated paper, polymeric film such as polyester film base (e.g., Polyethyleneterephthalate, Polyethylenenaphthalate, etc.), polycarbonate, cellulosic bases (such as cellulose acetate, cellulose triacetate, etc.), composite films, metals, metalized paper, or metal/paper laminates. These support bases may be primed or otherwise treated to improve adhesion and/or optical qualities of the support base as by flame treatment, corona discharge, ablation, quasiamorphization, sputtering, and the like.

The support base may be provided with optional layers. Some beneficial layers which may be included as desired are an antihalation layer (either on the backside of the support, as an underlayer between the support and the emulsion layer, or both), a slip layer (on the backside), a conductive layer (e.g., antistatic layer included as an underlayer or backcoat). The silver halide emulsion layer is deposited on the support (coated or not with other layers) and then the silver deposition nucleation layer is coated onto the silver halide emulsion layer.

These backcoats or undercoats usually comprise a hydrophilic polymer and another ingredient, such as a dye (for antihalation layers) or a conductive particle (for antistatic layers). The preferred hydrophilic polymer is gelatin, especially an inert deionized ossein type gelatin, and may be combined with hydrophilic binders such as starch, albumin, sodium alginate, hydroxyalkylcellulose, gum arabic, polyvinyl alcohol, polyvinyl pyrrolidone, carboxymethylcellulose, polyacrylamide or copolymers of styrene-maleic anhydride or polyvinyl methyl ether-maleic anhydride. The preferred anti-halation pigment in the undercoat layer is carbon black though other dyes or pigments that absorb at the wavelength of the imaging light source may also be used.

Carbon black also provides conductive properties which limit static build-up.

Optionally, included in both the back-side and face-side underlayer are coating aids (e.g. surfactants), matting agents, and hardening compounds for said hydrophilic binder.

Examples of surfactants include non-ionic surface active agents such as saponin, alkylene oxide derivatives, fluorinated surfactants, glycidol derivatives, fatty acid esters of polyhydric alcohols and alkyl esters of sugars, anionic surface active agents having an acidic group such as carboxyl, sulfo, phospho, sulfuric acid ester or phosphoric acid ester group, cationic surface active agents such as amino acids, aminoalkylsulfonic acids, aminosulfonic or phosphoric acid esters, alkylbetaines, amine oxides, alkylamine salts, aliphatic or aromatic quaternary ammonium or phosphoric salts, heterocyclic quaternary ammonium and aliphatic or heterocyclic ring-containing phosphonium or sulfonium salts. The matting agent may include silica, colloidal silica, polymeric beads, glass powder or starch powder.

The hardening agents may include organic and/or inorganic compounds for example: chromium or aluminum salts, aldehydes, N-methylol compounds, dioxane derivatives, active vinyl compounds such as triacryloylhexahydro-S-triazines or vinylsulfones, active halogen compounds such as dichlorohydroxy-S-triazines, or mucohalogenic acids. As examples of matting agents are silica and polymethylmethacrylate beads.

After coating any optional layers, the photosensitive silver halide layer is applied. The silver halide layer may be any silver halide emulsion known in the art. The silver halide layer preferably comprises negative acting silver halide grains in a hydrophilic binder, usually a gelatin. The silver halide used in this invention may consist of silver chloride, silver bromide, silver iodide, silver chlorobromide, silver bromoiodide or mixtures thereof. Included in the silver halide are preferably dopants from Group VIII of the Periodic Table, such as rhodium, ruthenium, iridium or mixtures thereof in the range $10^{-3}$ to $10^{-8}$ mole per mole of silver. The crystalline form of the silver halide may be monodispersed or polydispersed and may also be of the core-shell or tablet type grains. The preferred embodiment of the present invention is a 0.2–0.3 micron ruthenium-iridium doped monodispersed silver chlorobromide emulsion containing at least 60% chloride.

These emulsions can be chemically sensitized by known methods, for example alone or in combination with: sulfur sensitization as described in U.S. Pat. Nos. 1,574,944, 2,278,947, 2,410,689, 3,189,458 or 3,501,313; gold sensitization as disclosed in U.S. Pat. Nos. 2,597,856, 2,597,915 or 2,399,083; reduction sensitization as described in U.S. Pat. Nos. 2,518,698, 2,521,925, 2,487,850 or 2,6694,637. The photographic emulsions used in the present invention may be further sensitized with quaternary ammonium or phosphonium salts, thioether compounds, polyethylene oxide derivatives or diketones as disclosed in U.S. Pat. Nos. 2,708,162, 3,046,132, 3,046,133, 3,046,134 or 3,046,135.

The photographic emulsion of the present invention may be spectrally sensitized to any wavelength in either the visible, ultraviolet or infrared portion of the electromagnetic spectrum by methods known to those skilled in the art. Examples of spectral sensitizers used in the present invention may include anionic, cationic, betaine, cyanine, merocyanine or other sensitizing dyes well known in the photographic art.

The photographic emulsion layer may contain various compounds to prevent fogging of the light sensitive material of the present invention during preparation, storage or during processing. Such antifoggants and stabilizers may include azoles such as benzothiazolium salts, nitroindazoles, triazoles and benzimidazoles; heterocyclic mercapto compounds such as mercaptothiazoles, mercaptobenzothiazoles, mercaptobenzimidazoles, mercaptothiadiazoles or mercaptopyrimidines; thioketo compounds such as oxazolinthione; azaindenes such as tetraazindenes; benzenethiosulfonic acids or benzenesufinic acids.

Developing agents, complexing agents and other compounds known to be necessary in the development of lithographic printing plates may be included in one or more of the layers of the photosensitive element. If these compounds are included in the photosensitive element, an activator solution may be used to develop the lithographic plate. If these ingredients are not included in the photosensitive element, a developer solution will be required to develop the lithographic printing plate.

The photosensitive silver halide layer and the optional backcoats and undercoats may be applied by any known coating technique such as slide coating, bar coating, roll coating, knife coating, curtain coating, rotogravure coating, spraying, and dipping. When the undercoating is to include multiple sublayers, the sublayers may be applied consecutively or simultaneously, such as by a slide coater.

After the photosensitive silver halide has been applied, the receptor layer is coated onto the photosensitive silver halide layer. The receptor layer comprises physical development nuclei, which may be fine particles of metals such as silver, bismuth, antimony, cadmium, cobalt, lead, nickel, palladium, rhodium, gold, platinum, iron, etc., or sulfides, polysulfides or selenides of these metals, or mixtures thereof. The receptor layer may optionally also contain adjuvants such as binders, coating aids, antistatic compounds, hardeners, etc. similar to the examples described in the other coated layers.

The receptor layer may be coated from an organic solvent or, more preferably, from an aqueous medium. Although any known technique of coating from a solution or a dispersion may be used, slide coating is one preferred method. Tandem coating as disclosed in co-pending U.S. application Ser. No. 08/242,683 is another especially preferred coating method. Applicants have found that reducing the temperature of the coating solution for the receptor layer provides improved plates, by avoiding intermingling of the receptor layer and the silver halide emulsion layer. This intermingling is especially likely to occur when an aqueous coating medium is used which could interact strongly with the hydrophilic binder of the silver halide layer.

Therefore, a critical step in the practice of the present invention is controlling the temperature of the coating solution as it is applied to the silver halide emulsion layer coated support layer. It may be desirable to chill the coating apparatus or other system elements which contact the photosensitive element or the coating solution. The temperature of the coating solution just before it contacts the silver halide emulsion layer must be within the temperature range of above 0 and below 30° C. Preferably the temperature range of the coating solution is greater than 0° C. and no more than 20° C., more preferably between 0.1 and 15° C., and most preferably between 0.1 and 10° C. Performing the coating step of the silver deposition nucleating layer at these temperatures has been found to yield photosensitive elements with improved speed and contrast.

The following non-limiting examples further illustrate this invention.

EXAMPLE 1

A lithographic printing plate was made by coating the following layers on a clear gel subbed 0.1 mm polyester support (numbers in parentheses are the dried coating weights of the various components):

(a) an underlayer consisting of an aqueous carbon black dispersion (0.9 g/m$^2$) in deionized inert ossein gelatin (2.9 g/m$^2$), containing hydroquinone (0.4 g/m$^2$), hydroxymethylphenidone (0.08 g/m$^2$), silica matting agent (1.5 g/m$^2$), formaldehyde hardener (0.14 g/m$^2$), plus various coating aids.

(b) a ruthenium/iridium doped 75:25 mole % silver chlorobromide gelatin emulsion sensitized to 633 nm, having an average grain size of 0.3 microns, plus coating aids, a bacteriostat and a hardener (0.7 g/m$^2$ of silver, 1.3 g/m$^2$ gelatin and 0.14 g/m$^2$ formaldehyde).

After coating and drying the plate material was stored at 25° C. for seven days before applying the physical development nuclei:

(c) an aqueous palladium sol was prepared by reducing an acidic palladium chloride solution with potassium borohydride at 25° C. To the sol a dialdehyde starch and, just prior to coating, various coating aids are added (0.001 g/m$^2$ palladium, 0.04 g/m$^2$ dialdehyde starch). One sample was coated at 4° C. while another was coated at 51° C., and dried.

The plates were imagewise exposed on a Linotronic L-330 imagesetter and processed for 25 seconds in an alkaline activator solution and 3M brand Onyx™ stabilizer at 82° F. The composition of the alkaline activator is given below:

| | |
|---|---|
| Sodium sulfite | 42.5 g |
| Potassium hydroxide | 40.0 g |
| Sodium thiocyanate | 12.0 g |
| Trisodium phosphate | 0.2 g |
| Benzotriazole | 0.8 g |
| 1-phenyl-5-mercaptotetrazole | 0.12 g |
| Water to 1 Kg | |

Density measurements were made on the background (imagewise exposed) and transferred (unexposed) areas using a Macbeth densitometer. Plates were also run on a Heidelberg GTO press to determine roll-up, the minimum number of sheets to achieve acceptable copy. As shown in Table 1, the photosensitive elements which had the top coat applied at 4° C. had better roll-up, Dmin, ΔReflection Density, and ΔTransmission Density.

TABLE 1

| | (Average of 3 samples) | | | |
|---|---|---|---|---|
| Top Coat Temp. | Roll-Up | Dmin | ΔReflection Density* | ΔTransmission Density** |
| 4° C. | 10 | 0.626 | 0.71 | 0.37 |
| 51° C. | 15 | 0.780 | 0.60 | 0.14 |

*Background Image Reflection Density - Transfer Image Reflection Density

**Transfer Image Transmission Density - Background Image Transmission Density

EXAMPLE 2

A sample having an underlayer and emulsion layer was prepared as described in Example B above. The physical development nuclei layer was applied at 7.5° C. and 38° C. using the gravure method described in U.S. application Ser. No. 08/243,683.

Sensitometric response was evaluated by exposing the plates to a 633 nm. HeNe laser at 2 mJ/m$^2$ through a 0–3 continuous tone wedge, processing as described above and measuring the density gradient on a computerized reflection densitometer. Contrast values were taken as the gradient between 0.2 and 0.8 density above Dmin. The results shown in Table 2 demonstrate the improved Dmin and Contrast resulting from lower coating temperatures.

TABLE 2

| Top Coat Temp. | Dmin | Contrast |
|---|---|---|
| 7.5° C. | 0.602 | 1.376 |
| 38° C. | 0.796 | 0.845 |

We claim:

1. A method of manufacturing a photosensitive element, which can be exposed and developed by diffusion transfer processes to form a lithographic printing plate, comprising the steps of:

(a) providing a support layer, (b) coating a negative acting silver halide emulsion layer onto said support layer, and (c) coating a physical development nucleation layer comprising particles onto said silver halide emulsion layer, wherein the coating of said physical development nucleation layer is performed with a coating composition which is at a temperature above 0° C. and below 15° C.

2. The process of claim 1 wherein said temperature is between 0.1 and 10° C.

3. The process of claim 1 wherein the physical development nucleation layer is slide coated onto the silver halide emulsion layer.

4. The process of claim 1 wherein the physical development nucleation layer is tandem coated onto the silver halide emulsion layer.

* * * * *